United States Patent [19]
Chen et al.

[11] Patent Number: 5,514,609
[45] Date of Patent: May 7, 1996

[54] THROUGH GLASS ROM CODE IMPLANT TO REDUCE PRODUCT DELIVERING TIME

[75] Inventors: Min-Liang Chen, Hsinchu; Ying-Kit Tsui, Taipei; Jau-Nan Kau, Hsinchu, all of Taiwan

[73] Assignee: Mosel Vitelic, Inc., Hsinchu, Taiwan

[21] Appl. No.: 242,382

[22] Filed: May 13, 1994

[51] Int. Cl.⁶ ............................................. H01L 21/8246
[52] U.S. Cl. .................... 437/45; 437/48; 437/38
[58] Field of Search .................. 437/38, 45, 48, 437/931, DIG. 35

[56] References Cited

U.S. PATENT DOCUMENTS 4,364,167  12/1982  Donley.
4,513,494   4/1985  Batra ........................................ 437/48
5,270,237  12/1993  Sang et al. .............................. 437/45

OTHER PUBLICATIONS

Wolf, "Silicon Processing for the VLSI era, vol. 1", 1986, pp. 539–541.

*Primary Examiner*—Chandra Chaudhari
*Attorney, Agent, or Firm*—Townsend and Townsend and Crew

[57] ABSTRACT

A read only memory semiconductor integrated circuit device includes an improved cell region and a method of manufacture therefor. The improved cell region includes a recessed dielectric region overlying a gate electrode region. Such recessed dielectric region allows for an implanting or coding step to occur after the dielectric layer is applied to the surface of the device. Coding of the ROM device during a latter processing step shortens product turn-around-time. The improved cell also includes an improved method of manufacture. Such method provides for a dielectric layer formed over a gate electrode of a partially completed device. The method further provides etching the upper portion of the dielectric layer overlying the gate electrode to form a recessed region. A step of coding or implanting is then performed to change the device from enhancement mode into depletion mode, thereby providing the ROM code for the designated cell.

30 Claims, 5 Drawing Sheets

THROUGH GLASS ROM CODE IMPLANT TO REDUCE PRODUCT DELIVERING TIME

BACKGROUND OF THE INVENTION

The present invention relates to semiconductor integrated circuits and their manufacture. The invention is illustrated in an example with regard to the manufacture of a read only memory cell, and more particularly to the manufacture of a voice read only memory cell which is coded before metallization, but it will be recognized that the invention has a wider range of applicability. Merely by way of example, the invention may be applied in the manufacture of other semiconductor devices such as mask ROMs, among others.

Read only memories (ROMs) and various methods of their manufacture are known in the art. In the fabrication of a ROM, it is necessary to fabricate a storage cell that maintains data after the applied power is turned off, that is, a storage cell having almost permanent data characteristics. The storage cells are generally mass data storage files where each cell corresponds to the presence or absence of a transistor. Data is programmed into the cells during their manufacture. The process of programming data is often called coding. Examples of cell coding methods include field oxide programming, implant programming, and through-hole programming.

Field oxide programming provides for two types of metal oxide semiconductor field effect transistors (MOSFET) by the use of different gate oxide layer thickness for each transistor type. Each oxide layer thickness corresponds to a different transistor threshold voltage. In programmed cells, the thickness of the gate oxide layer is about the same thickness as the field oxide, thereby providing a transistor which is permanently "off" or in a logic "0" state. Unprogrammed cells include typical thicknesses for the gate oxide layer so that the transistor is "on" or in a logic "1" state. A disadvantage of the field oxide programming method includes a longer product turn-around-time (TAT) as measured from the programming step. Much of the process occurs after programming the gate oxide layers of the cells.

Another programming technique is the threshold voltage implant method which changes the transistor threshold voltage by ion implanting the transistor gates for programmed cells. In n-channel devices, impurities such as boron are implanted into exposed gates which raise their threshold voltage. The implant forces the gates of the cells permanently to an "off" state. Unexposed gates are not implanted and therefore provide cells at an "on" state. Heavy implants, however, often create damage to the thin gate oxide region. Damage to the gate oxide region causes higher parasitic junction capacitance between the source (or drain) and channel region of the metal oxide semiconductor field effect (MOS) transistor. Higher parasitic junction capacitance leads to an increase in average word-line capacitance, and often results in slower speeds.

A further method of ROM programming includes selectively opening the contact holes for each transistor to drain. Such method called the through-hole contact programming technique was, in fact, the historical ROM programming method. The through-hole contact programming technique, however, requires a contact for every cell, thereby increasing the size of the cell array. Increasing the size of the cell array often provides a resulting device which has a lower cell density. Lower cell density typically corresponds to higher integrated circuit costs, and less memory capacity which is incompatible for the higher memory ROM devices.

It is often desirable to apply the ROM code onto the partially completed devices during a latter part of the manufacturing process. By applying the code at the latter process, it takes less time to process the wafer from that point to completion. Less time for completion corresponds to a faster product turn-around-time. As the life cycle of integrated circuits become shorter, it is typically desirable to fabricate products with shorter turn-around-times.

Industry relies on two general types of ROM array structures and combinations thereof using cells fabricated by the described methods. Such array structures include the serial ROM cell structure which is a NAND gate type structure and the parallel ROM cell structure known as the NOR gate type structure. Characteristics of NOR and NAND gate type structures are often competing.

A parallel NOR gate type structure includes a set of MOS transistors connected in parallel to the bit-line. The parallel structure typically increases the speed of the ROM but decreases bit or cell packing density. The lower density is caused by the use of a larger cell size. The larger cell size exists from the contacts needed for each cell.

Alternatively, a serial NAND gate type structure often increases cell packing density or bit density but provides a slower operation speed. The serial structure forms a denser structure since no contact holes are required. Higher memory requirements for state-of-art devices use the denser serial NAND gate type structure.

Still further, competition in the semiconductor industry creates a need for products having identifiable features for the purpose of recognizing chip piracy. Piracy of semiconductor designs tends to increase as world-wide demand for semiconductor chips grows. However, it is often difficult to determine whether a competitor's chip has been copied or actually infringes a patented process or structure without extensive investigation. Accordingly, it is desirable to manufacture a semiconductor chip with features therein for easy identification.

From the above it is seen that a method of fabricating semiconductor ROM devices that is easy, reliable, cost effective, and identifiable is often desired.

SUMMARY OF THE INVENTION

The present invention provides an improved method and resulting structure for an integrated circuit device. In particular, the present invention provides an improved ROM integrated circuit and method of manufacture therefor.

An embodiment includes an improved method of forming a semiconductor device such as a ROM integrated circuit device. The improved method includes the steps of providing a partially completed semiconductor device having at least a gate electrode and a channel region. The method also includes forming a dielectric layer overlying the gate electrode and removing a thickness of a portion of the dielectric layer to form a recessed region of dielectric layer overlying the gate electrode. Impurities are then implanted through the recessed region portion of the dielectric layer and the gate electrode. An annealing step then removes defects caused by the implant and drives the impurities into the channel region.

A further alternative embodiment includes a semiconductor device such as a partially completed ROM integrated circuit device having at least a gate electrode and a channel region. A dielectric layer having an upper recessed region is defined overlying the gate electrode and a channel region is implanted with impurities through the recessed region portion of the dielectric layer and the gate electrode.

Benefits of the various embodiments include a faster product turn-around-time which occurs by programming the device at a latter process than the prior art. In particular, less steps are needed to complete the wafer after programming the cells than the prior art. An additional benefit includes the use of the dielectric layer overlying various cell structures before the program step. The dielectric layer makes the partially completed wafer more durable than a wafer without an overlying dielectric layer. A further benefit includes the easy identification of programmed cells by inspecting for the recessed region of dielectric layer over the gate electrode.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Prior Art ROM Structures

Figure 1:
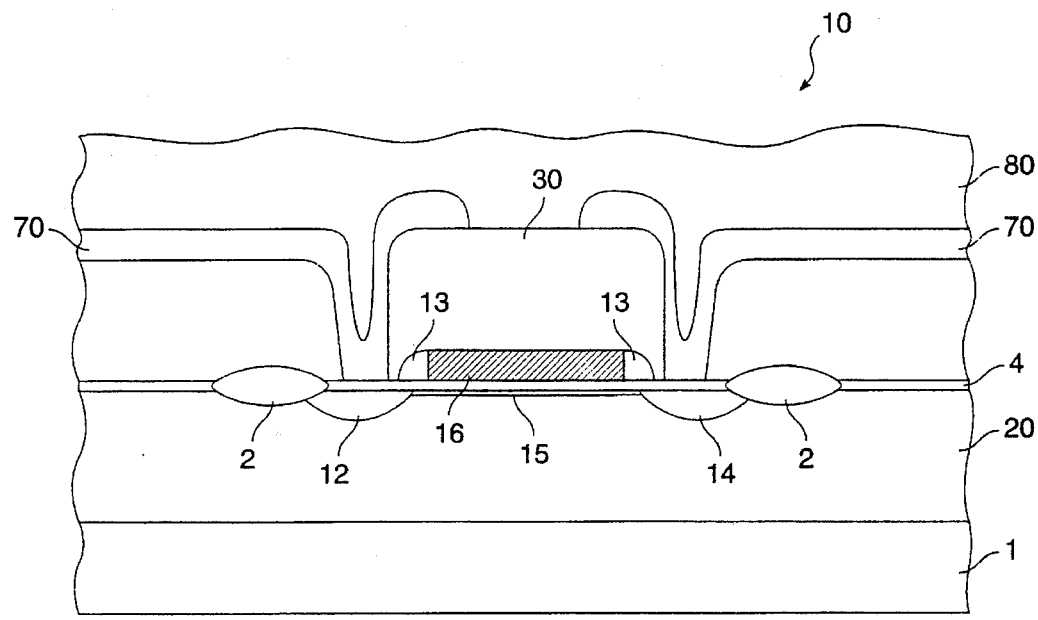
FIG. 1 is a cross-sectional view of a prior art ROM semiconductor device.
Figure 2:
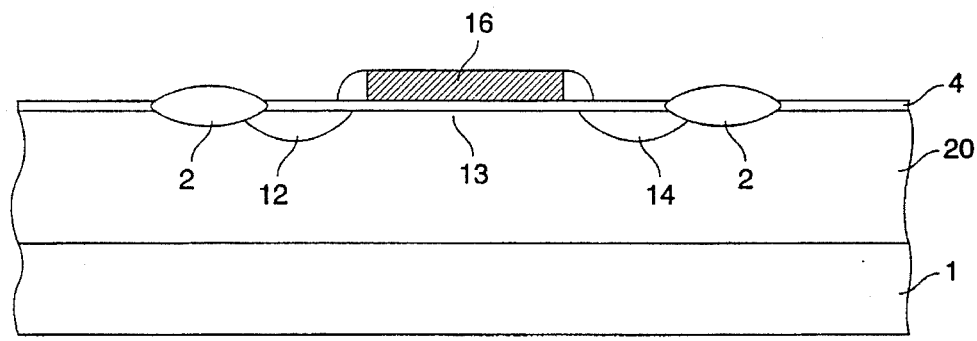
FIGS. 2–6 illustrate a method of fabricating the prior art device of FIG. 1.

FIG. 1 is a cross-sectional view of a programmed cell 10 for a typical prior art ROM device fabricated by the threshold voltage implant method. The programmed cell may be used for a NAND gate type array structure. The threshold voltage implant method changes an enhancement mode n-channel metal oxide semiconductor field effect transistor (MOSFET) into a depletion mode device by implanting n-type ions into the channel region of the MOS transistor. The n-type implant programs or codes the transistor of the cell.

The programmed cell 10 includes a depletion mode MOS transistor in a semiconductor substrate 1. The programmed cell defines a p-type well region 20, field oxide regions 2, gate oxide region 4, and source/drain regions 12, 14. The programmed cell also defines an implanted channel region 15 under the gate oxide region 4. The implanted channel region changes the enhancement mode MOS transistor into the depletion mode transistor. A polysilicon gate 16, gate sidewall spacers 13, borophosphosilicate glass layer 30 (BPSG), metallization layer 70, and surface passivation 80 are also shown. The polysilicon gate, source region, drain region, and channel region define the depletion mode MOSFET.

Each cell, such as the cell of FIG. 1, corresponds to a region for storing bits of information in a ROM semiconductor integrated circuit chip. Thousands and even millions of these microscopically small regions make up a core memory area (or active cell area) of the ROM chip. The completed ROM chip also includes peripheral circuits, interconnects, and bonding pads.

Prior Art Fabrication Methods

A simplified prior art ROM fabrication process may be briefly outlined as follows:

(1) Provide semiconductor substrate.
(2) Grow gate oxide layer.
(3) Deposit gate polysilicon layer and dope.
(4) Mask 1: Define gate polysilicon layer to form polysilicon gate regions.
(5) Mask 2: Define N– type LDD regions and implant.
(6) Mask 3: Define P– type LDD regions and implant.
(7) Form sidewall spacers on the polysilicon gate regions and densify.
(8) Mask 4: Define N+ type source/drain regions and implant.
(9) Mask 5: Define P+ type source/drain regions and implant.
(10) Mask 6: Define exposed ROM code regions.
(11) Implant exposed regions (up to 200 KeV) to provide ROM code.
(12) Form oxide layer.
(13) Deposit BPSG layer and reflow.
(14) Mask 7: Define contact plug regions on BPSG layer.
(15) Etch contact plug holes through BPSG and oxide layer.
(16) Mask 8: Define contact plug implant regions and implant.
(17) Anneal contact plug implant.
(18) Sputter aluminum metallization.
(19) Mask 9: Define aluminum metallization.
(20) Deposit surface passivation layers.
(21) Mask 10: Define pad regions with pad mask.

This sequence of processing steps codes or programs the ROM at steps 10 and 11. Prior to the programming steps, the partially completed wafer typically awaits for a customer ROM code at the wafer bank. After receiving the ROM code, the partially completed wafer is removed from the wafer bank, is coded, and undergoes the remaining process steps to form the completed wafer. The completed wafer then undergoes assembly and testing before the completed product is delivered to the customer.

Product TAT typically begins at mask 6 and ends upon shipping the packaged and tested product to the customer. The prior art fabrication method requires at least twelve major fabrication steps to complete the wafer and typically may take up to 35 days. The completed wafer then under goes assembly and testing which often takes an additional 10 days. It is often desirable to reduce the number of processing steps from the coding step to final testing of the device. Less steps after coding generally reduces product TAT for the customer. Details of the prior art fabrication method are described below.

FIGS. 2–6 illustrate a threshold voltage implant method of fabricating the prior art ROM device such as the device of FIG. 1. The prior art method includes providing a semiconductor substrate 1. A p-type well region 20 is then defined into the semiconductor substrate 1. Field oxide regions 2 and a gate oxide region 4 are then formed onto the semiconductor substrate. The field oxide region is typically formed by the local oxidation of silicon, also known as LOCOS. Source 12 and drain 14 regions are then formed by conventional techniques known in the art. Such techniques include steps of implanting impurities to form the lightly doped drain regions forming sidewall spacers 13, and implanting additional impurities for the source and drain regions. A polysilicon gate region 16 is also defined on the gate oxide layer 4 overlying a channel region 13. The polysilicon gate region, source and drain regions, and channel region define a partially completed enhancement mode MOS device for the ROM cell.

Figure 3:
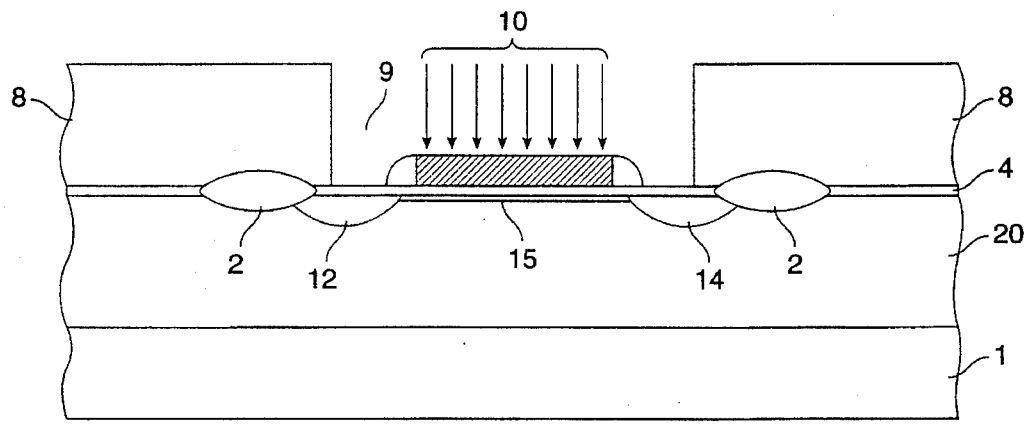

FIG. 3 illustrates the prior art method of coding or programming the cell to an "on" state or logic "1" state through ion implantation of the channel region. Such method includes applying a photoresist mask overlying the top surface of the partially completed device. Steps of exposing and developing the photoresist mask define a coding mask 8 with an exposed region 9. A step of ion implanting 10 introduces impurities into the polysilicon gate region. An annealing step then diffuses the impurities from the polysilicon gate to the implanted channel region 15 to form the depletion mode MOS device. The coding mask 8 is then stripped by conventional techniques in the art.

Figure 4:
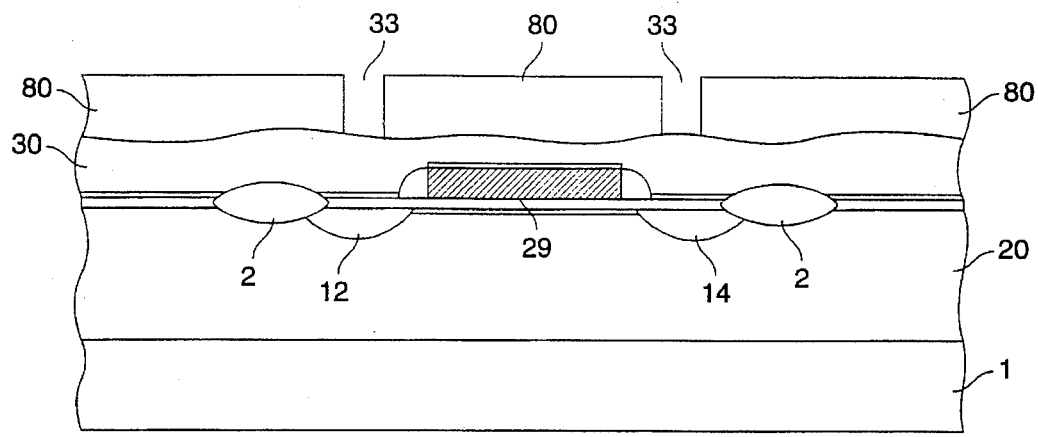

The prior art method then includes forming a thin oxide layer 29 overlying the surface of the device of FIG. 4. Borophosphosilicate glass 30 (BPSG) is then applied onto the oxide layer and flowed. Contact mask 80 forms overlying the BPSG layer. Such contact mask layer provides openings 33 over the source 12 and drain 14 regions. An etching step exposes the top portion of source 12 and drain 14 regions. Contact mask 80 is then stripped.

Figure 5:
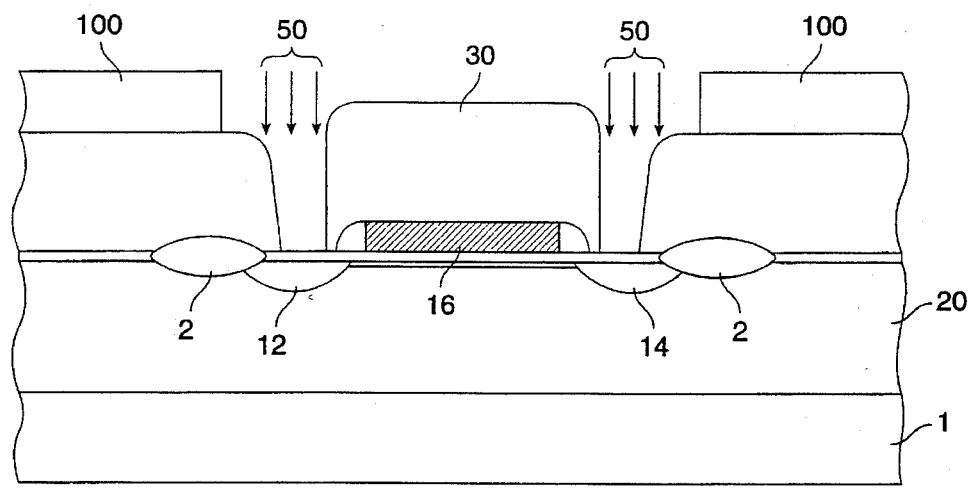
Figure 6:
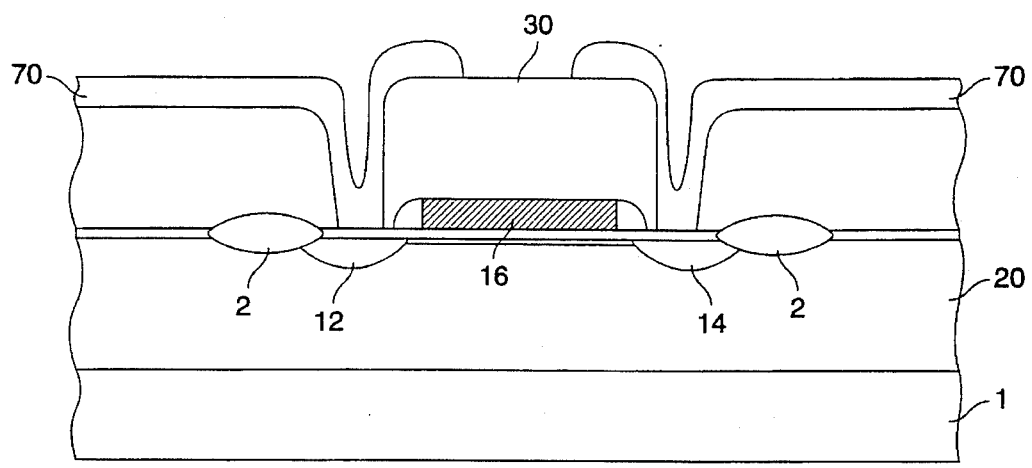

An implanting mask 100 used for defining contact plugs forms overlying the BPSG layer as illustrated in FIG. 5. An implanting step 50 is performed to form the contact plugs. The substrate is then annealed to drive in the impurities. A step of aluminum sputtering follows the annealing step to define a metallization layer 70 illustrated in FIG. 6. It should be noted that the completed device also includes surface passivation having pad openings and peripheral circuits.

Improved ROM Embodiments

Figure 7:
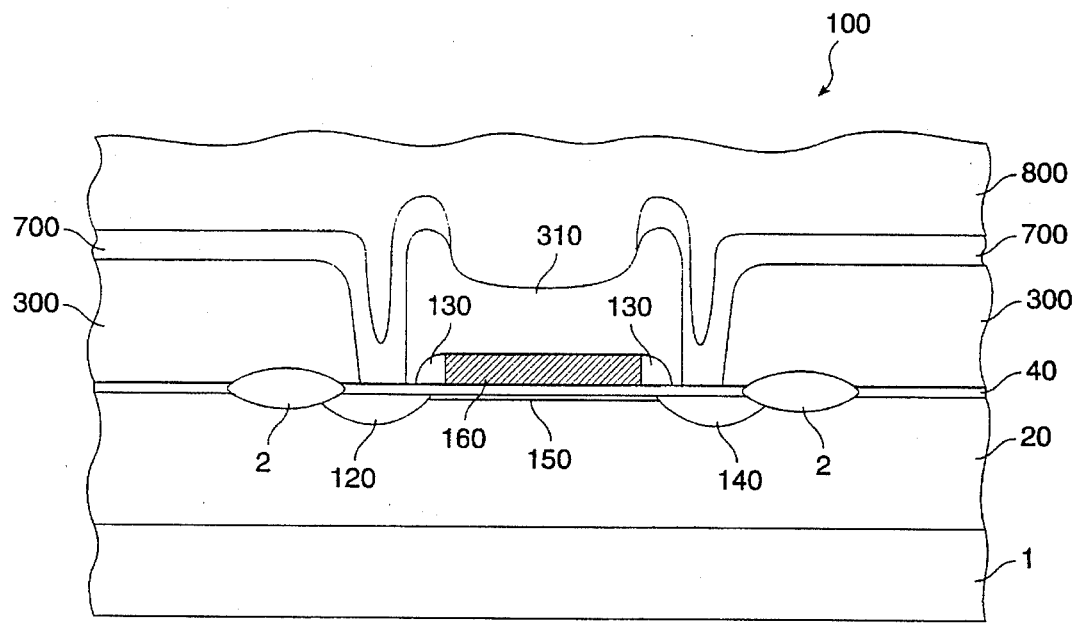
FIG. 7 is a cross-sectional view of an embodiment of the improved ROM device.

An embodiment of the improved ROM cell 100 is illustrated in FIG. 7. The improved ROM cell may, for example, be used for NAND type gate structures. Programming or coding the MOS transistor in the cell typically occurs by implanting the channel region with impurities to change an enhancement mode device into a depletion mode device. Impurities include n-type and p-type depending upon the particular application. The improved ROM cell includes substrate 1, p-type well region 20, field oxide regions 2, source region 120, and drain region 140. Alternatively, the cell may also include an n-type well region having corresponding source and drain regions. A polysilicon gate region 160 is defined overlying a thin gate oxide layer 40 defined over the channel region 150. Sidewall oxide spacers 130 are formed on the polysilicon gate edges. The channel region 150 has been implanted or coded with impurities to change the enhancement mode MOS device into the depletion mode device.

The improved ROM cell also includes a dielectric layer 300, metallization layer 700, and surface passivation 800. The dielectric layer typically includes an oxide layer which has an overlying insulating material such as BPSG, PSG, TEOS, among others. It should be noted that a portion of the dielectric layer overlying the polysilicon gate layer has a recessed top surface 310. Such recess is partially caused by etching and implanting or coding the cell. The details in fabricating the improved ROM cell 100 are illustrated by FIGS. 8–12 and described below.

Improved ROM Fabrication Methods

An embodiment of the improved ROM fabrication method is shown as follows:

(1) Provide semiconductor substrate.
(2) Grow gate oxide layer.
(3) Deposit gate polysilicon layer and dope.
(4) Mask 1: Define gate polysilicon layer to form polysilicon gate regions.
(5) Mask 2: Define N– type LDD regions and implant.
(6) Mask 3: Define P– type LDD regions and implant.
(7) Form sidewall spacers on the polysilicon gate regions and densify.
(8) Mask 4: Define N+ type source/drain regions and implant.
(9) Mask 5: Define P+ type source/drain regions and implant.
(10) Form oxide layer.
(11) Deposit BPSG layer and reflow.
(12) Mask 6: Define contact plug regions on BPSG layer.
(13) Etch contact plug holes through BPSG layer and oxide layer.
(14) Mask 7: Define contact plug implant regions and implant.
(15) Mask 8: Define exposed ROM code regions (etch ROM code regions).
(16) Implant (double implant) exposed regions to provide ROM code.
(17) Anneal contact implant.
(18) Sputter aluminum metallization.
(19) Mask 9: Define aluminum metallization.
(20) Deposit surface passivation layers.
(21) Mask 10: Define pad regions with pad mask.

Before programming steps 15 and 16, wafers awaiting for ROM codes are typically stored in the wafer bank. Upon receiving the customer ROM code, the partially completed wafer is removed from the wafer bank, is coded, and undergoes the remaining process steps to form the completed wafer. The completed wafer then undergoes an assembly and test operation to form the finished product which is delivered to the customer.

Product TAT for the customer begins at step 15, rather than step 10 of the prior art, and ends upon shipping the completed product. The present method includes at least seven major fabrication steps rather than twelve steps of the prior art to form the completed wafer. Accordingly, this embodiment provides for less processing steps after receiving the customer order and therefore reduces product TAT for the customer.

FIGS. 8–12 illustrate a method of fabricating the improved ROM device according to the present invention. The embodiment of FIGS. 8–12 is shown for illustrative purposes only, and therefore should not limit the scope of the invention recited by the claims.

An embodiment of the improved method is illustrated by FIGS. 8–12. The improved method is, for example, a ROM cell programmed through implantation of the MOS channel region. Implantation changes an enhancement mode device into a depletion mode device. Such MOS structure may be, for example, incorporated into an NAND type gate structure.

The improved method includes providing a cell 100 having a p-type well region 20. Alternatively, the cell may also have n-type well regions or a combination of p-type and n-type well regions. Field oxide regions 2 are defined onto the cell using the local oxidation of silicon ordinarily known as LOCOS.

A gate electrode region 160 forms overlying a thin layer of gate oxide 40. The gate electrode includes a thickness of polysilicon ranging from about 1,000 Å to about 3,500 Å, and preferably at about 2,500 Å. Of course, the thickness of the gate electrode layer depends on the particular application. The gate electrode may also be a silicide gate, polycide gate, or the like, and combinations thereof. The silicide may be selected from refracting metal combinations such as $WSi_2$, $TaSi_2$, $TiSi_2$, $CoSi_2$, $MoSi_2$, among others. The silicide gate typically has less resistivity than heavily doped polysilicon, thereby promoting a faster device.

Figure 8:
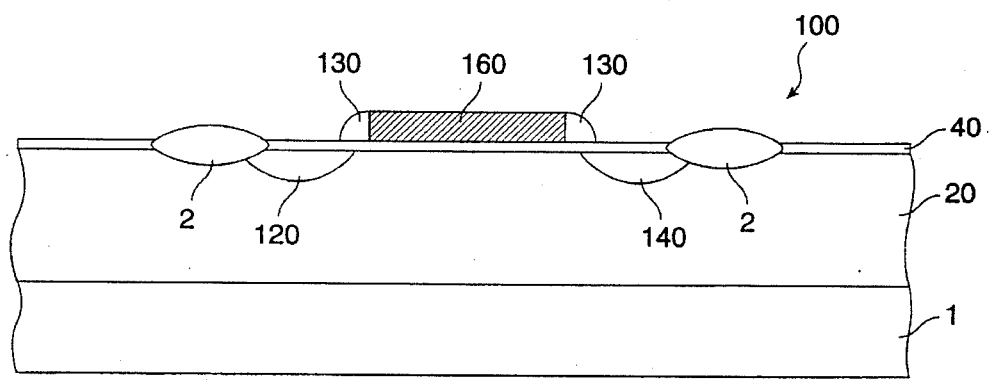
FIGS. 8–12 illustrate a method of fabricating the improved device of FIG. 7 according to the present invention.

A source region 120 and drain region 140 form adjacent to the gate electrode. A channel region forms underlying the gate electrode 160 and between the source 120 and drain 140 regions. Such source and drain regions are fabricated by conventional techniques for forming lightly doped drain (LDD) regions. Implants for the LDD regions occur after forming the gate electrode region. Sidewall spacers 130 are then defined on the gate electrode sides. Source and drain implants are then formed through a self-aligned process. A thin screen oxide layer may be formed over the exposed source and drain regions before their implant. The resulting structure is depicted by FIG. 8.

Figure 9:
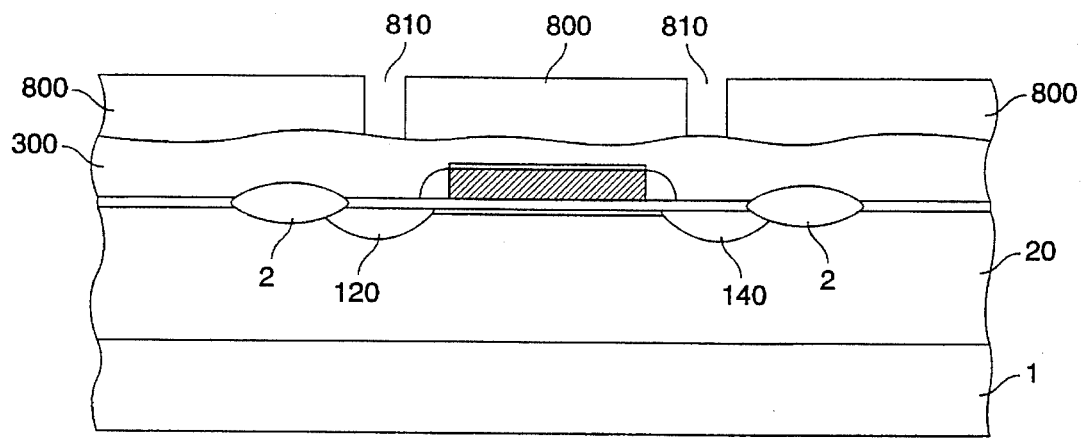

The improved method then forms a dielectric layer 300 overlying the top surface of the cell elements as illustrated in FIG. 9. Such dielectric layer is typically a nonconformal insulating material such as BPSG, PSG, among others which is later flowed. The thickness of the resulting dielectric layer ranges from about 5,000 Å to about 9,000 Å, and is preferably about 7,000 Å. The dielectric layer also typically includes an underlying layer of oxide of higher quality. Such oxide layer includes a thickness ranging from about 500 Å to about 1,500 Å, and preferably at about 1,000 Å. Preferably, the oxide layer is also undoped.

The partially fabricated wafer having the cell structure of FIG. 4 (without photomask 80) is typically stored in wafer bank to await for a customer ROM code. Less fabrication steps occur from this point to the final processing of the wafer than the prior art method, thereby providing an improved method with a faster product TAT. The cell structure also includes a dielectric layer overlying the surfaces of the cell which should partially seal and protect the cell surfaces while being stored in the wafer bank. By sealing the cell surfaces, the wafer may be stored at this step over a longer period of time than the prior art. Accordingly, the present method provides wafers having longer storage times and faster product TATs to the customer. Upon receiving the ROM code, the process steps are further illustrated as follows.

Figure 10:
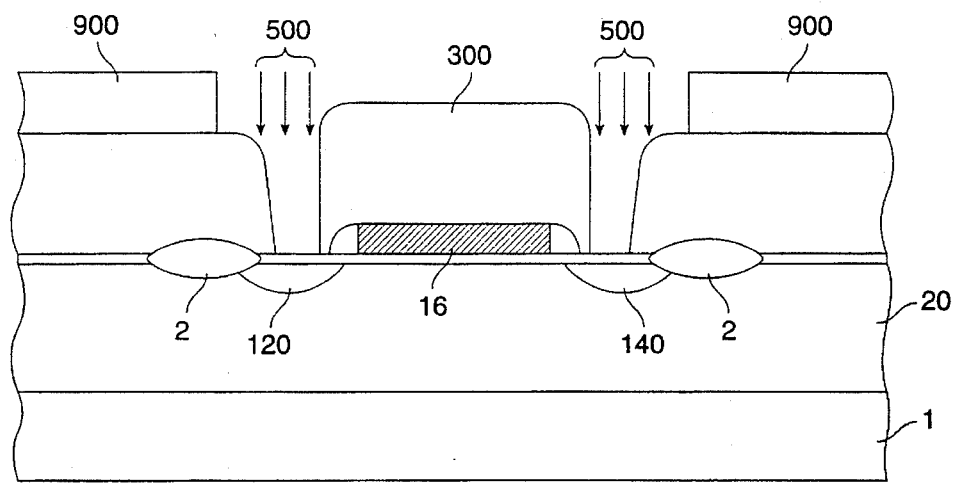

A photoresist mask 800 or contact mask forms over the dielectric layer to define openings 810 over the source 120 and drain 140 regions. An etching step removes exposed portions of the dielectric layer including the oxide layer to clear off the top surface of the source and drain regions as shown in FIG. 10. The etching step is typically an anisotropic etch using a reactive ion etch or plasma etch. A thin layer of screen oxide is then grown overlying the source and drain regions. Alternatively, a thin layer of oxide may remain overlying the source and drain regions after the etching step. The oxide layer protects the underlying source and drain regions during a subsequent implanting step 500. The masking layer is then stripped by techniques known in the art.

FIG. 10 illustrates the implant 500 of impurities into the source 120 and drain 140 regions to form the contacts plugs. It should be noted that the implant process self-aligns because the dielectric layer 300 directs the implant into the source and drain regions. An additional masking layer 900 may also mask a portion of the dielectric layer. Optionally, masking layer 800 of FIG. 9 rather than mask 900 may be used to direct the implant and protect portions of the dielectric layer. The impurities include phosphorous, boron, among others. The mask is then stripped by techniques known in the art.

Figure 11:
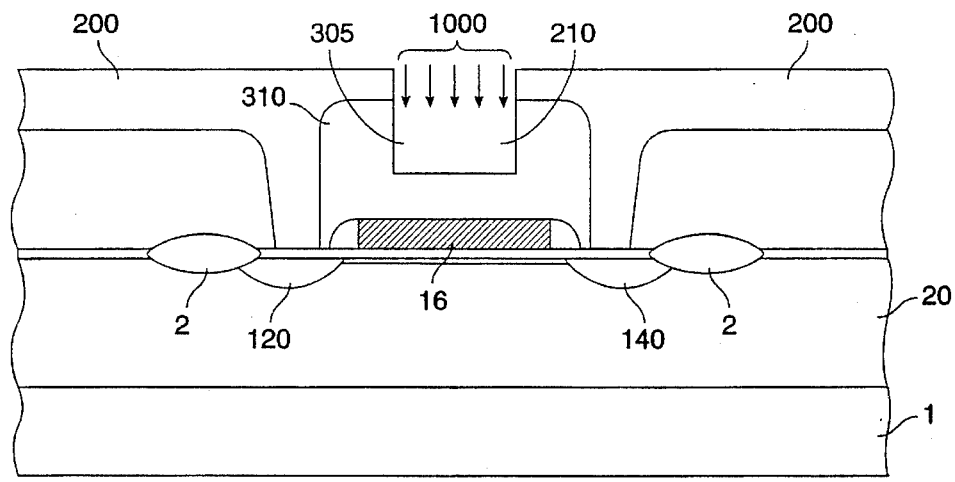

FIG. 11 illustrates another photoresist mask 200 or coding mask formed overlying the top surface of the device. Exposed portions 305 of photomask are defined over the dielectric layer overlying the gate electrode. The exposed portion 305 of dielectric layer 300 is etched to form a resulting dielectric layer including the oxide layer 301 having a thickness ranging from about 1,500 Å to about 2,500 Å, and preferably at about 2,000 Å. Etching of the dielectric layer is typically anisotropic and creates a shallower dielectric region or recessed region overlying a portion of the polysilicon gate region. Reactive ion etching, plasma etching, and the like may be used for the anisotropic etch. A thinner dielectric layer is often preferable for allowing the subsequent implant to penetrate through the polysilicon gate region. A thicker dielectric layer is often more difficult to implant through. Of course, the thickness of the dielectric layer depends on the particular application.

Coding or programming the cell occurs through ion implantation of impurities 1000. Preferably, implantation should penetrate the dielectric region and gate electrode region. However, implant energies are, for example, limited to about 200 KeV for typical implant processes using an impurity species with a single charge. Accordingly, implants should use impurities having higher charges and an energy of at least 150 KeV to compensate the implant through the dielectric including the oxide layer. The combination of impurities with higher absolute charges and higher energies provides for cell coding through the dielectric layer.

For example, n-type ion implants having two positive charges (p++), extracted by the electric field as per conventional techniques, are implanted at an effective energy of about 400 KeV through the remaining dielectric layer and into the gate region 160 to code the ROM cell. The n-type ions are obtained from ionized arsenic or phosphorus having two empty valence sites. Such ions carry about twice the amount of charge as regularly ionized arsenic or phosphorus with one empty valence site (p+). Implants for double ionized phosphorus are carried out from about 150 KeV to about 250 KeV, and is preferably at about 200 KeV. Alternatively, double ionized arsenic implants are carried out at from about 500 KeV/cm$^2$ to about 600 KeV/cm$^2$, and preferably at about 550 KeV/cm$^2$. Of course, implant energy and concentration depends on the particular application. Implantation occurs substantially through the dielectric layer and gate electrode and may not damage the gate oxide layer.

Annealing the partially completed device removes damage from the implant and is performed after ion implantation. The impurities change the enhancement mode MOS transistor to the depletion mode device.

Figure 12:
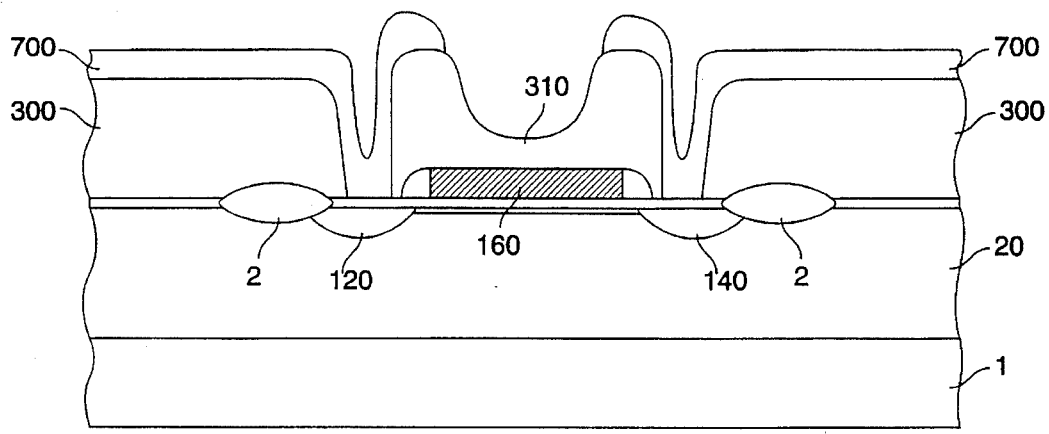

FIG. 12 illustrates the device having a metallization layer 700 overlying the source 120 and drain 140 regions. The completed device is easy to identify from the recessed dielectric layer 310 overlying the gate electrode. As previously noted, the recess occurs from the previous etching and implanting steps. The completed device also includes surface passivation. The passivation layer may include silicon dioxide, silicon nitride, and combinations thereof.

EXAMPLES

To prove the principle and demonstrate the improved implanting method, a simulation was defined and performed.

The simulation used a voice ROM cell coded by ion implantation. Such voice ROM cell includes a polysilicon gate electrode having a thickness of about 2,500 Å. BPSG was grown to a thickness of about 7,000 Å over an undoped oxide layer of about 1,000 Å. The BPSG layer was flowed to form a substantially flat top surface. Contact plug regions were defined and implanted. A portion of BPSG over the gate electrode was defined and dry etched to a thickness of about 1,000 Å. The undoped oxide layer of about 1,000 Å under the BPSG layer was left intact. The etched portion of BPSG and undoped oxide formed a recessed region having a thickness of about 2,000 Å over the gate electrode.

Figure 13:
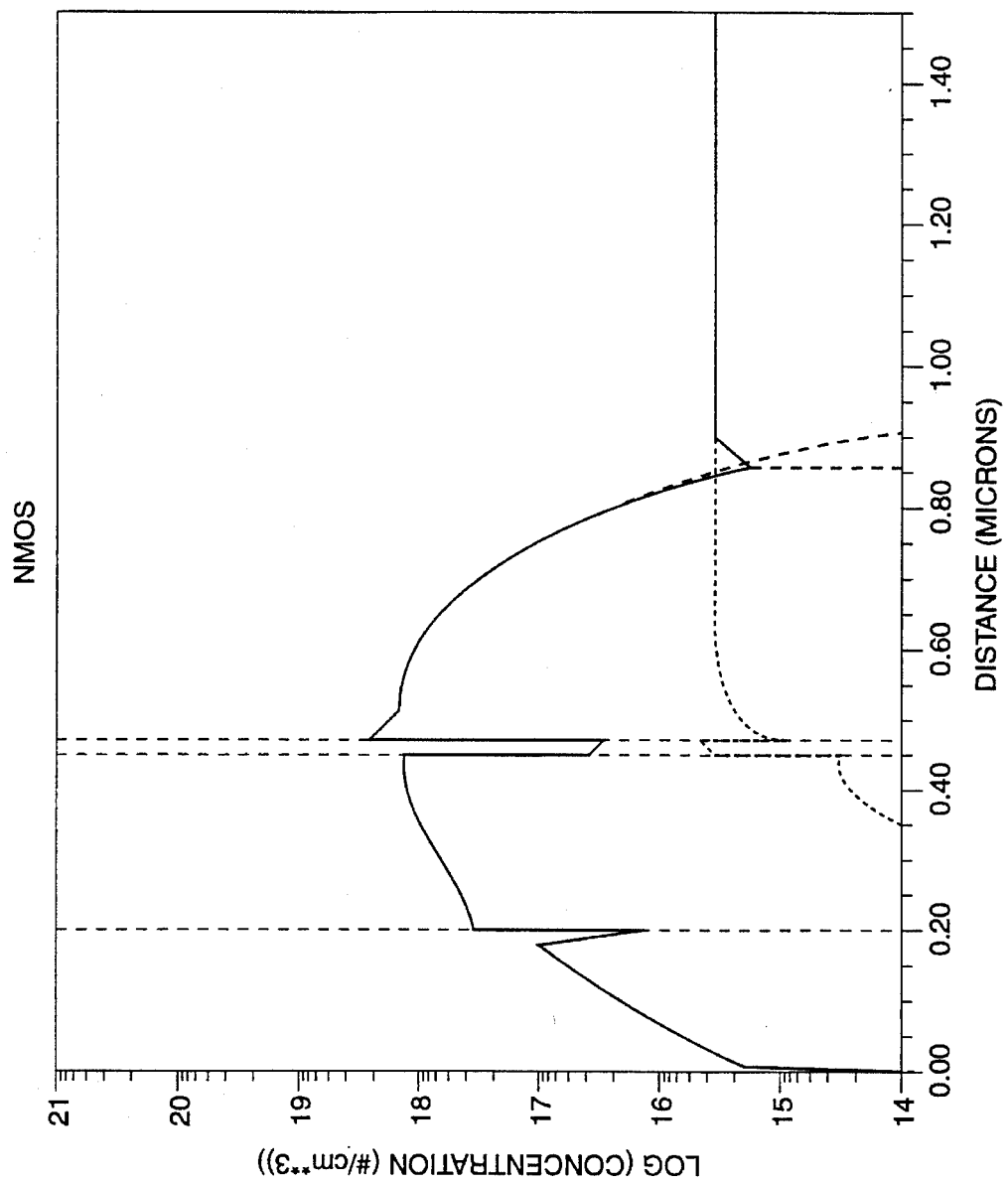
FIG. 13 illustrates simulation results of an embodiment of the improved method.

Double ionized phosphorus was implanted through the recessed region of the BPSG and oxide layer and the polysilicon. The implant went into the n-type channel of the enhancement mode MOS device to form a depletion mode device. Implant conditions for the double ionized phosphorus implant includes an energy of about 360 KeV at $6 \times 10^{13}$ atoms/cm$^2$. At such conditions, the channel junction depth was about 0.385 μm. FIG. 13 illustrates the dopant concentration (atoms/cm$^3$) as a function of depth from the top surface of the BPSG layer. The solid and dotted lines represent the phosphorus dopant concentration and p-type well region concentration, respectively. Dashed vertical lines at 0.2, 0.45, and 0.475 μm represent the interface at the dielectric layer/gate electrode, gate electrode/gate oxide, and gate oxide/p-type well region, respectively.

Table 1 below summarizes various channel junction depths (μm) as a function of remaining BPSG thickness (Å), poly thickness (Å), implant energy (KeV), and implant dose (atoms/cm$^2$). Table 1 also lists standard parameters and resulting junction depths labeled as "STAND" in the step column.

TABLE 1

| | Input Parameter | | | | Output Parameter |
|---|---|---|---|---|---|
| Step | Poly | BPSG | Energy | Dose | Junction Depth |
| 1 | 2500 | 2000 | 360 | 6 E + 13 | 0.385 |
| 2 | 2500 | 1500 | 380 | 8 E + 13 | 0.475 |
| 3 | 2500 | 2500 | 370 | 1 E + 14 | 0.353 |
| 5 | 2250 | 1500 | 370 | 6 E + 13 | 0.481 |
| 6 | 2250 | 2500 | 360 | 8 E + 13 | 0.361 |
| 4 | 2250 | 2000 | 380 | 1 E + 14 | 0.457 |
| 9 | 2750 | 2500 | 380 | 6 E + 13 | 0.341 |
| 7 | 2750 | 2000 | 370 | 8 E + 13 | 0.383 |
| 8 | 2750 | 1500 | 360 | 1 E + 14 | 0.424 |
| 11 | 2750 | 2500 | 340 | 1 E + 14 | 0.281 |
| 12 | 2750 | 2500 | 340 | 8 E + 13 | 0.273 |
| 13 | 2750 | 2500 | 340 | 6 E + 13 | 0.268 - Worst case |
| 14 | 2750 | 2500 | 320 | 6 E + 13 | 0.233 |
| 15 | 2750 | 2500 | 330 | 6 E + 13 | 0.257 |
| STAND | 2750 | 150 | 180 | 6 E + 13 | 0.2473 |
| STAND | 2500 | 150 | 180 | 6 E + 13 | 0.2676 |

The oxide thickness overlying the polysilicon gate electrode was at a constant of about 1,000 Å. Even worse case parameters having a gate polysilicon layer thickness at 2,750 μm, BPSG thickness at 2,500 μm, implant energy at 340 KeV, and dose at $6 \times 10^{13}$ atoms/cm$_2$ provide a satisfactory junction depth of about 0.268 μm for the voice ROM integrated circuit device. Samples numbered 1–13 provide satisfactory junction depths. Remaining samples 14 to 15 were simply too shallow to provide for reliable devices according to the particular simulation. Accordingly, the results of Table 1 illustrate the reliable formation of the depletion mode device using the method according to the present invention.

While the above is a full description of the specific embodiments, various modifications, alternative constructions and equivalents may be used.

Therefore, the above description and illustrations should not be taken as limiting the scope of the present invention which is defined by the appended claims.

What is claimed is:

1. A method of forming a semiconductor device comprising the steps of:
    providing a partially completed semiconductor device comprising at least a gate electrode and a channel region;
    forming a dielectric layer overlying said gate electrode, said dielectric layer comprising a BPSG layer overlying an oxide layer;
    removing a thickness of said dielectric layer overlying said gate electrode to form a dielectric layer comprising a recessed region;
    implanting impurities through said recessed region and through at least a portion of said gate electrode; and
    annealing said implant;
    wherein said BPSG layer and oxide layer after said removing step have a combined thickness ranging from about 1,500 Å to about 2,500 Å.

2. A method of manufacturing an integrated circuit device comprising the steps of:
    providing a partially completed semiconductor device comprising a gate electrode, a channel region, a source region, and a drain region;
    forming a dielectric layer overlying said gate electrode, said source region, and said drain region;
    exposing said source region and said drain region;
    forming contact plugs on said exposed source region and said exposed drain region;
    forming a recessed region on a portion of said dielectric layer overlying said gate layer; and
    implanting impurities through said recessed region and said gate electrode.

3. The method of claim 2 further comprising a step of annealing said implant.

4. The method of claim 2 wherein said impurities are impurities having an absolute charge greater than one electron volt.

5. The method of claim 4 wherein said implanting step is at an energy greater than 150 KeV.

6. The method of claim 2 wherein said dielectric layer is a BPSG layer overlying an oxide layer.

7. The method of claim 6 wherein said BPSG layer and oxide layer at said recessed region have a combined thickness ranging from about 1,500 Å to about 2,500 Å.

8. The method of claim 2 wherein said partially completed semiconductor device is an MOS device for a ROM cell.

9. The method of claim 2 further comprising a step of forming a masking layer overlying said dielectric layer before said recessed region forming step, said masking layer having an exposed region over said gate electrode.

10. The method of claim 2 wherein said impurities are selected from the group consisting of boron, phosphorous, and arsenic.

11. The method of claim 2 wherein said recessed region forming step is an anisotropic etching step.

12. A method of implanting impurities in an integrated circuit device comprising the steps of:
    providing a partially completed semiconductor device comprising a polysilicon layer overlying a substrate;

forming a dielectric layer overlying said polysilicon layer;

forming a recessed region on a portion of said dielectric layer overlying said polysilicon layer;

implanting impurities comprising an absolute charge greater than one electron volt through said recessed region and said polysilicon layer; and annealing said implant to drive-in said impurities into said substrate.

13. A method of making a read only memory comprising the steps of:

forming MOS transistors in a ROM region of an integrated circuit, said MOS transistors comprising a dielectric layer thereon, said dielectric layer comprising a BPSG layer overlying an oxide layer;

storing said integrated circuit; and programming said ROM region by the steps of etching a thickness of said dielectric layer from gate regions of selected MOS transistors and implanting impurities through said gate regions into channel regions of said selected MOS transistors, wherein said BPSG layer and oxide layer have a combined thickness ranging from about 1,500 Å to about 2,500 Å.

14. The method of claim 1 wherein said impurities are impurities having an absolute charge greater than one electron volt.

15. The method of claim 14 wherein said implanting step is at an energy greater than 150 keV.

16. The method of claim 1 wherein said partially completed semiconductor device is an MOS device for a ROM cell.

17. The method of claim 1 further comprising a step of forming a masking layer overlying said dielectric layer before said removing step, said masking layer having an exposed region over said gate electrode.

18. The method of claim 1 wherein said impurities are selected from a group consisting of boron, phosphorous, and arsenic.

19. The method of claim 1 wherein said removing step is an anisotropic etching step.

20. The method of claim 1 wherein said implanting step implants impurities completely through said gate electrode.

21. The method of claim 2 wherein said gate electrode is a double layer gate electrode comprising a silicide.

22. The method of claim 12 wherein said partially completed semiconductor device is an MOS device in a ROM cell.

23. The method of claim 12 wherein said recessed region of said dielectric layer is fabricated by anisotropic etching.

24. The method of claim 12 wherein said gate electrode is a double layer gate electrode comprising a silicide.

25. The method of claim 12 wherein said dielectric layer is a BPSG layer overlying an oxide layer.

26. The method of claim 12 wherein said BPSG layer and oxide layer at said recessed region includes a combined thickness ranging from about 1,500 Å to about 2,500 Å.

27. The method of claim 13 wherein said impurities are impurities having an absolute charge greater than one electron volt.

28. The method of claim 27 wherein said implanting step is at an energy greater than 150 KeV.

29. The method of claim 13 wherein said impurities are selected from the group consisting of boron, phosphorous, and arsenic.

30. The method of claim 13 wherein said gate electrode is a double layer gate electrode comprising a silicide.

\* \* \* \* \*